July 19, 1966 J. N. CARMAN 3,261,075

SEMICONDUCTOR DEVICE

Original Filed Sept. 22, 1959

INVENTOR
JUSTICE N. CARMAN

BY [signature]
ATTORNEY 3,261,075
Patented July 19, 1966

3,261,075

SEMICONDUCTOR DEVICE

Justice N. Carman, Gloucester, Mass., assignor to Carman Laboratories Inc., a corporation of Massachusetts Original application Sept. 22, 1959, Ser. No. 841,513, now Patent No. 3,200,310, dated Aug. 10, 1965. Divided and this application Dec. 10, 1964, Ser. No. 435,103
8 Claims. (Cl. 29—25.3)

This application is a division of my application Serial No. 841,513, filed September 22, 1959 (now Patent No. 3,200,310, granted August 10, 1965), which in turn was a continuation-in-part of my application Serial No. 763,-548, filed September 26, 1958 (now abandoned).

This invention relates to semiconductor devices such as rectifiers, transistors, and negative temperature coefficient resistances, and more particularly to the assembly of such devices with supporting and conductive leads. The invention provides an improved junction-type semiconductor device comprising a semiconductor crystal bonded by a bonding layer fusible only at temperatures above 700° C. to conductive leads whose coefficient of thermal expansion substantially matches that of the crystal, and which in its preferred form is provided with a protective encapsulation (preferably glass) surrounding the edge of the crystal and fused into contact with the assembly of leads and crystal. The resulting structure is mechanically strong, and one in which the electrical properties of the crystal are effectively protected against deterioration. Additionally, the invention provides a method for making these new and improved semiconductor devices.

Semiconductor devices are frequently in the form of a thin crystal wafer having one or more junctions between n and p regions of the crystal. Such junctions may be formed by physically joining n and p type crystals, or by diffusion of a donor or acceptor impurity into a high-purity silicon, germanium, or equivalent crystal. In any case, the junction between the n and p regions terminates at the edge bounding the crystal faces. Heretofore it has been the practice to solder fine wire leads or other conductive terminals to opposite faces of the crystal or to regions of the crystal spaced from the junction. The crystal is then encapsulated in a protective enclosure. The resulting device is incapable of withstanding high operating temperatures, or sudden power surges which momentarily create high temperatures, because the solder bond between the crystal and the lead wire or other terminal is easily destroyed at only moderately elevated temperatures. Moreover, protective enclosures which can be applied to crystals to which leads have been fastened by a low melting solder are not entirely reliable for protecting the crystal from contamination and resulting deterioration of its electrical properties. Such enclosures also are inadequate for protecting the crystal from vibration or other mechanical damage.

The present invention provides an improved semiconductor device in which the foregoing disadvantages of heretofore known semiconductor assemblies are overcome. The invention is directed particularly to semiconductor devices comprising a semiconductor crystal laterally bounded by a circumferential edge and having at least one n-p junction terminating at said edge, with conductive leads secured by a bonding layer to the faces of said crystal on opposite sides of said junction. (The term "lead" is used throughout this specification to include wire leads, conductive bases, and other forms of terminal connections.) In accordance with the invention, each of the leads has a coefficient of thermal expansion substantially matching that of the crystal. The bonding layer is of such composition that it is fusible only at temperatures above 700° C., and preferably above 800° C. A protective envelope surrounding the circumferential edge of the crystal generally is provided. Preferably such envelope is of glass having a coefficient of thermal expansion substantially matching that of the crystal, and advantageously it is fused into contact therewith and also into glass-to-metal sealed relation with the end portions of the leads adjoining the crystal.

The invention is particularly applicable to semiconductor devices in which the semiconductor crystal is siliconiferous, i.e. is composed of silicon or a semiconducting silicon compound such as silicon carbide. In order to protect such a crystal from deleterious contamination by impurities from the leads, and also to protect the leads from attack by etching solutions to which they may be exposed, it is desirable to have all surfaces of the leads adjacent the crystal provided with a thin continuous surface coating of at least one metal selected from the group consisting of platinum, palladium, rhodium, iridium, ruthenium, osmium, gold, silver, and alloys thereof which fuse at temperatures above 700° C. The bonding layer by which the leads are secured to the faces of the crystal preferably is formed of a metal selected from the group consisting of silver, platinum, palladium, and alloys thereof which fuse at above 700° C., bonded to a face of the crystal. With such a coating layer on the leads, and with such a bonding layer securing the leads to the crystal, the crystal is easily able to withstand fusion about it of the protective glass envelope; and it is easily able to withstand subsequent operation at very high temperatures (up to a red heat) without mechanical injury and without deterioration of its electrical properties.

The method of the invention for making glass encapsulated semiconductor devices of the character described comprises bonding conductive leads to the faces of the crystal on opposite sides of its n-p junction by means of a bonding layer fusing at above 700° C., enclosing the circumferential edge of the crystal with glass having a coefficient of thermal expansion substantially matching that of the crystal, and heating the glass-enveloped assembly of leads and crystal to a temperature above the softening point of the glass until the glass has fused into direct contact with the assembly. Most conveniently, this method is carried out by enclosing the circumferential edge of the crystal and the adjoining end portions of the leads in a tubular bead of the glass, and heating the bead in such position to a temperature above its softening point until it has fused into glass-to-metal sealed relation with the leads and, preferably, into direct contact with the circumferential edge of the crystal.

Preferred and illustrative embodiments of the invention are described in detail below with reference to the accompanying drawings, in which FIG. 1 is a sectional view of a junction-type diode assembly;

Figure 1:
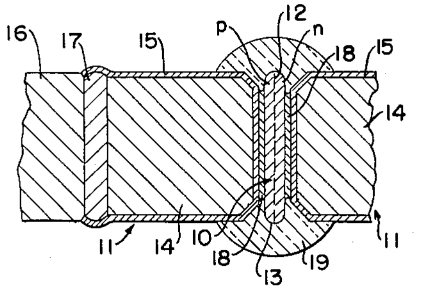

It is to be noted that the drawings are highly schematic. They show the significant structural features of devices made according to the invention, but the proportions and geometrical forms of the parts of actual devices may and often will be quite different from the proportions and geometrical forms of the corresponding parts as shown in the drawings.

Shown in FIG. 1 is a diode assembly comprising a semiconductor crystal wafer 10, which in actual size is typically 0.002 inch (0.05 mm.) in thickness and 0.060 inch (1.5 mm.) in diameter, mounted between a pair of conductive leads 11. Advantageously the crystal 10 is pure silicon to which minute controlled amounts of impurities have been added so as to form p and n regions on either side of a junction 12. The junction terminates at the circumferential edge 13 of the crystal, and the conductive leads are bonded to faces of the crystal on opposite sides of the junction. While a number of different substances including germanium and certain intermetallic crystals, possess semiconductor properties and can be used in preparing semiconductor devices according to the invention, the invention particularly contemplates devices in which a siliconiferous crystal is the semiconducting element. By the term "siliconiferous" I mean to include crystals of pure silicon and semiconducting crystals of silicon compounds, such as silicon carbide, which possess chemical and metallurgical properties similar to pure silicon. The formation of siliconiferous crystal wafers having n-p junctions therein is well understood in the art and is not in itself a part of this invention.

The conductive leads 11 bonded to the crystal comprise a core 14 of a material having a coefficient of thermal expansion substantially matching that of the crystal 10. Silicon and most other semiconductors are quite brittle, and are rather easily injured mechanically if subjected to substantial stress. To assure against injury of the crystal when it is heated and cooled through a large temperature range (as is contemplated by the invention), the materials in direct contact with the crystal should therefore have expansion characteristics which do not differ very much from that of the crystal. The closeness with which the thermal expansivity of the lead material must match that of the crystal is of course dependent on such factors as the actual size of the crystal, the temperature range through which it is to be heated, the rigidity of the bond between crystal and leads, and the geometrical configuration of crystal and leads. These factors must be such that the maximum thermally-induced stress to which the crystal is subjected does not exceed that which it is able to withstand without cracking or other injury. The thermal expansion coefficient of silicon is approximately $4.2 \times 10^{-6}$ cm./cm./° C., and in general relatively massive bodies having a thermal expansion coefficient in the range from 3.0 to $5.5 \times 10^{-6}$ cm./cm./° C. are sufficiently closely matched to permit being bonded directly to the crystal. Tungsten, molybdenum and "Kovar" (an alloy composed nominally of 29% nickel, 17% cobalt, balance iron) all are metals having thermal expansion coefficients which are sufficiently close to that of silicon to be useful in forming the core 14 of the conductive leads. Of these metals, molybdenum and tungsten are preferred because their thermal expansion characteristics most closely approximate those of silicon, and because they have good thermal conductivity characteristics. Thermal conductivity of the lead is important, to facilitate dissipation of heat when the device is operated at a high power level.

For a number of reasons, the core component of the lead is encased by a substantially continuous surface coating 15, which, as shown in FIG. 1, should thoroughly cover all surfaces of the leads adjacent the crystal. The coating 15 protects the lead core from corrosive attack by the etching solution used for the final clean-up of the surface of the crystal prior to encapsulation, and it prevents deleterious oxides of the core component from impairing the electrical characteristics of the crystal. To perform these functions, the protective coating 15 should be resistant to oxidation at elevated temperatures and to attack by the etching solution. Materials which possess these properties, and which are well suited to form the protective coating 15, are the noble metals platinum, palladium, rhodium, iridium, ruthenium, osmium, gold, and silver. Alloys of these metals, with each other and with yet other metals, also may be employed to form the protective coating. Rhodium, however, is preferred for the reason that it is particularly effective for protecting the core component of the lead assembly from corrosion and oxidation, and in addition it forms a very effective diffusion barrier between the lead and the crystal. Protection of the crystal from interdiffusion with the lead core is of importance in the case of devices intended for operation at sustained high temperatures.

A thin layer of any of the aforementioned coating metals may be applied to the tungsten or other core component by electroplating, using conventional plating baths and plating techniques for doing so. Thin electroplated coatings may be somewhat porous, and in order to insure thorough coverage of the lead core by the coating, electroplated coatings preferably are sintered at 1000° C. to 1200° C. or higher for a substantial period of time (usually ten minutes to an hour or so). Such heating effects closure of any pores that may exist in the electrodeposited metal.

Instead of applying the protective coating 15 by electrodeposition, it may be applied by any other desired coating procedure. For example, it may be applied by an evaporation or sputtering technique, or it may in some cases be formed by chemical reduction of the metal on the surface of the core component 14. An alloy coating may be formed by applying successive coatings of components of the alloy, and then heating to effect interdiffusion of these coatings into a single coating of more or less uniform composition throughout its thickness.

It is sometimes advantageous to form a composite protective coating on the core of the lead. Such composite coats may include a non-noble undercoat, over which one of the above specified coating metals is applied. For example, a relatively thick undercoat of cobalt or nickel may first be applied to the core component, and then a thin outer coat of platinum, rhodium, or the like, may be formed over such undercoat. In this manner effective coating of the leads may be effected with a minimum thickness and hence minimum cost of noble metal.

The protective coating 15 preferably covers all surfaces of the core component 14 adjacent the crystal 10. Such coating may be applied to all surfaces of short lengths of the core component; or alternatively, as illustrated in FIG. 1, the core component of tungsten, molybdenum, or the like, may be joined to a copper or other metal lead wire 16 by a weld indicated at 17, and the surfaces of the core component may then be plated up to such weld.

Each lead 11 is bonded to a face of the crystal 10 at a position substantially separated from the peripheral boundary of the n-p junction 12, by a bonding layer 18. This bonding layer is preferably formed of a metal selected from the group consisting of silver, platinum, palladium and alloys thereof which fuse at temperatures above 700° C. This layer is securely bonded both to a coated surface of the lead and to a face of the crystal, and integrally joins the leads and the crystal together into a unitary structure. It also provides a low resistance electrical and thermal connection of the leads to the crystal, to permit free flow of electric current to and from the crystal, and ready dissipation of heat from the crystal.

Silver, and more particularly an alloy composed of 5% to 15% by weight gold and the balance silver, are preferred metals for the bonding layer 18. The melting temperature, the electrical and thermal conductivities, the ability to wet silicon, and the oxidation and corrosion resistances of these metals makes them especially suitable for bonding the leads to the crystal. Five to fifteen percent gold alloyed with silver significantly enhances the resistance of the metal to attack by the etching reagent; and since gold does not form intermetallic compounds with silicon it does not lead to excessive hardening of the bonding layer. Platinum and palladium alloyed (in amounts from 5% to 25% by weight) with silver are even more effective than gold for increasing resistance of the metal to attack by the etchant.

Bonding of the leads to the crystal faces is accomplished by heating the bonding metal to a fusion temperature while it is in contact with both the leads and the crystal. For example, a thin disk of the bonding metal may be held under pressure between the end faces of the leads and the crystal faces to which the leads are to be joined, and the assembly may then be heated sufficiently to effect fusion (partial or complete) of the bonding metal. Normally for this purpose the assembly is heated to a temperature in the range from 900° C. to 1050° C. A temperature above 900° C. is preferable in order to insure the formation of a secure bond between the crystal and the leads; but heating above 1050° C. should be avoided in order to insure against impairment of the electrical properties of the crystal.

Pure silver melts at 960° C., and an alloy of 10% gold, 90% silver (a preferred bonding alloy) melts at only a slightly higher temperature. However, fusion of these bonding metals in contact with the semiconductor crystal will occur at substantially lower temperatures. Evidently enough interdiffusion of silicon or germanium with the bonding metal occurs to form an alloy which fuses at a temperature substantially below the normal melting temperature of the bonding metal itself. Hence a fusion bond between the crystal and the lead is achieved even at temperatures below the actual melting temperature of the bonding metal. Consequently, even platinum, palladium, and alloys of these metals with each other or with silver which normally melt at temperatures above 1050° C. can be fused to the semiconductor crystal without heating to above such temperature. The bonding metal, including its silicon eutectic, should, however, be fusible only at temperatures above 700° C., and preferably above 800° C., so as to be able easily to withstand fusion at the temperature to which the assembly of leads and crystal must be heated to fuse a glass envelope thereabout.

In case an alloy bond is desired, the alloy and the bond may be formed concurrently. For example, a bonding layer composed of a gold-silver alloy may be formed by applying a coating of gold to the core of the lead, and then heating the thus-coated lead in contact with a layer of silver which is in turn in contact with the crystal. The gold and silver fuse together, or interdiffuse, and the silver fuses to the crystal, to form a gold-silver alloy bond between the lead and the crystal. Other alloy bonding layers may be similarly formed. The proportions of the components of the alloys thus formed may be approximately controlled by controlling the thicknesses of the respective layers prior to heating to form the bond.

Ordinarily heating the assembly of lead, crystal and bonding metal to the bonding temperature is carried out in a reducing atmosphere. It may however be carried out in a vacuum chamber from which the air has been exhausted. It may also be carried out in a neutral atmosphere, such as an atmosphere of an inert gas, e.g. nitrogen, argon, helium, or the like.

Although particular mention has been made of supplying the metal for the bonding layer 18 in the form of a thin disk, it is obvious that it can be supplied in other ways equally well. It can for example be supplied in the form of finely divided metal powder pressed between the crystal and the leads, or it may be supplied in the form of a plating or coating deposited electrolytically or by other means on the ends of the leads, or on the faces of the crystal. It may also be supplied in the form of a button fused on to the end of the lead. Or, when the coating 15 on the surface of the lead components 14 is composed of one of the metals suitable for use as a bonding metal, then such coating may itself function in the dual capacity of a coating and as a source of bonding metal of which the bonding layer 18 is formed.

It is sometimes desirable to alloy the metal of the bonding layer with an element of the third or fifth group of the Periodic Table which is capable of functioning as an acceptor or donor of electrons from or to the semiconductor crystal. Third group elements which may be used successfully are boron, aluminum, gallium, and indium; and fifth group elements which may be used with success are phosphorus, arsenic and antimony. Inclusion of any of these elements in the bonding layer is determined in accordance with desired electrical properties of the device. They may lower the electrical resistance of the crystal in the conducting direction, or they may otherwise modify the electrical characteristics of the crystal itself or of the interface between the crystal and the bonding layer. If any of these third or fifth period elements is alloyed with the metal forming the bonding layer, it preferably is used in a concentration in the range from 1% to 5% by weight of the bonding metal alloy.

Having welded the leads 11 to the semiconductor crystal, the next step ordinarily is to subject the exposed peripheral edge 13 of the crystal to an etching treatment to remove any thin surface contamination which might permit development of an electrical shunt around the peripheral boundary of the n-p junction 12. Such etching ordinarily is performed by immersing the assembly of leads and crystal in an oxidizing acid solution. The manner in which such etching is carried out, and the particular solution used for the purpose is well understood in the art of making semiconductor devices and is not in itself a part of this invention. However, one of the important functions performed by the coating metal 15 on the surfaces of the leads is to protect the core components 14 from attack by the etching solution. This protection is important not only to avoid corrosion of the leads, but more particularly to preclude contamination of the crystal by reaction products of the etchant with the metal of the lead core. The noble metals used in accordance with the invention to form the bonding layers 18 also are highly resistant to the etching solutions normally employed, and are neither corroded thereby nor converted to reaction products with the etching solution which might objectionably contaminate the semiconductor crystal.

A feature of the invention is that the assembly of leads and crystal advantageously is encapsulated in a protective envelope preferably of glass, which may be fused into direct contact with the peripheral edge of the crystal. Such encapsulation may be effected immediately after completion of the etching treatment. FIG. 1 shows a device in which a protective glass envelope 19 is fused about the peripheral edge 13 of the crystal and into glass-to-metal sealed relation with the adjoining end portions of the leads 11. A convenient procedure for applying the glass envelope 19 is to insert the assembly of leads and crystal into a short tubular glass bead, in such position that the crystal is disposed about at the center of the bead. The assembly then is heated to above the softening temperature of the glass for a sufficient period of time to fuse the glass into direct contact with the end portions of the leads and preferably also with the edges of the crystal. If desired, the glass bead while heated to above its softening temperature may be mechanically pressed to insure effective sealing of the glass to the leads and to the exposed edges of the crystal.

The glass of which the envelope 19 is composed should be one having a coefficient of thermal expansion substantially matching that of the crystal 10, and of course also substantially matching the coefficient of thermal expansion of the lead cores 14. As with the lead cores, the coefficient of expansion of the glass preferably falls in the range from 3.0 to $5.5\times10^{-6}$ cm./cm./° C. A number of glasses having such a coefficient of thermal expansion are available commercially, and others may be compounded specially. The glass forming the protective envelope 19 advantageously also has a softening point well below the fusion temperature of the bonding layer 18. While it is feasible to fuse the envelope 19 into contact with the crystal edges and the leads at a temperature above the fusion temperature of the bonding layer 18, it is not generally convenient to do so. Accordingly, the glass employed preferably softens sufficiently to be fused into place about the crystal and the leads at a temperature below 850° C., and preferably below 800° C. In the manufacture of preferred devices according to the invention, a glass bead is fused about the crystal at a temperature in the range from 650° C. to 800° C.

The glass must of course be one having good electrical properties and must be free of constituents which might deleteriously contaminate the semiconducting crystal. In general, glasses composed solely of metal oxides meet these requirements. This limitation is hardly a restriction on the scope of the wide range of glass compositions that can be employed, however, for most glasses nominally have such composition. Mainly it is a restriction against the use of glasses made under conditions which do not exclude substantial amounts of impurities, and it is a restriction against the use of a few special glasses to which non-oxidic constituents are intentionally added.

Table I lists several glass compositions which can be used successfully to form the protective glass envelope 19. It is understood that the compositions set forth in Table I are merely illustrative of a very large number of glass compositions that can be used for the purpose:

TABLE I

| Glass | $SiO_2$ | ZnO | $GeO_2$ | $B_2O_3$ | $P_2O_5$ | $Na_2O$ | $K_2O$ | $Al_2O_3$ | BeO | MgO |
|---|---|---|---|---|---|---|---|---|---|---|
| A ..........percent.. | ------ | 60 | 8 | 32 | ------ | ------ | ------ | -------- | ------ | ------ |
| B ..........do.... | 8 | 60 | ------ | 32 | ------ | ------ | ------ | -------- | ------ | ------ |
| C ..........do.... | ------ | 65 | ------ | 30 | 5 | ------ | ------ | -------- | ------ | ------ |
| D ..........do.... | ------ | 60 | ------ | 34 | ------ | ------ | ------ | 5 | 1 | ------ |
| E* ..........do.... | 80.5 | ------ | ------ | 12.9 | ------ | 3.8 | 0.4 | 2.2 | ------ | ------ |
| F* ..........do.... | 67.3 | ------ | ------ | 24.6 | ------ | 4.6 | 1.0 | 1.7 | ------ | 0.2 |

*Commercial low expanding borosilicate glasses for glass-to-metal seals with tungsten.

While the invention contemplates fusing the glass envelope 19 into direct contact with the peripheral edge 13 of the semiconductor crystal such is not essential. Even when such contact is intended the glass envelope may fail to make contact with all points of the crystal edge. For example, the viscosity of the hot glass may be sufficiently high so as to prevent it from flowing into tiny crevices between the lead and the crystal, or a small gas bubble may become entrapped between the edge of the crystal and the glass envelope. Such defects ordinarily are not of significance. Semiconductor devices in which such defects exist will ordinarily perform as well and display the same mechanical ruggedness as devices in which the glass envelope intimately makes contact with the entire peripheral surface of the crystal.

It is of some importance that the glass envelope be effectively bonded in tight glass-to-metal sealed relation with the leads 11. One of the functions of the glass envelope is to protect the crystal from exposure to extraneous contaminants in the ambient atmosphere; and to perform this function effectively, the interface between the glass envelope and the surfaces of the leads should be free from any leakage paths providing communication between the outside atmosphere and the surface of the crystal. Similarly, there should be no leakage paths through the glass bead providing communication from the atmosphere to the surface of the crystal. A leak-free seal of the glass to the leads is not nearly so critical as in a vacuum tube, however. Whereas a small leak will quickly result in inoperativeness of the vacuum device, it merely opens the door to a somewhat shortened life of a semiconductor device according to this invention.

Figure 2:
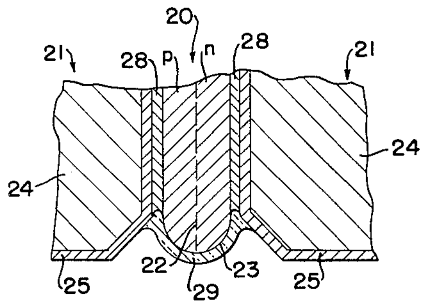
FIGS. 2 and 3 are enlarged fragmentary sectional views showing alternative forms of the diode of FIG. 1.
Figure 3:
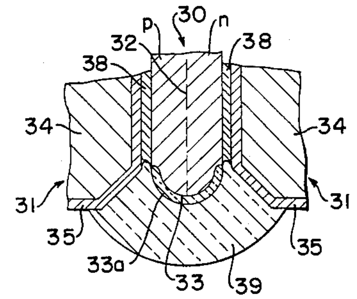

FIGS. 2 and 3 show alternative procedures for forming the protective glass envelope about the peripheral edge of the semiconductor crystal. FIG. 2 portrays schematically a diode comprising a semiconductor crystal 20 bonded to leads 21. The crystal comprises a thin wafer of silicon or the like having a n-p junction 22 terminating at a peripheral edge 23 of the crystal. The leads comprise a core component 24 having a coefficient of expansion substantially matching that of the crystal 20; and the surfaces of the core component are coated with a metal coating 25 similar to the coating 15 of FIG. 1. The leads are bonded to faces of the crystal on opposite sides of the n-p junction by bonding layers 28 similar to the bonding layers 18 of FIG. 1. The peripheral edge of the crystal wafer 20 is protected by a glass envelope 29 which is generally similar to the envelope 19 of FIG. 1. However, the glass envelope 29 of FIG. 2 is formed by applying a glass glaze to the exposed peripheral edge of the semiconducting crystal. Such glaze may be any such of the glass compositions as described above in connection with FIG. 1 but is applied to the crystal edge in the form of a powder, or a slurry of the glass powder in a suitable vehicle. After the edge of the crystal has been coated with the glaze composition in dry powdered or slurry form, the assembly is heated sufficiently to fuse the particles of glass powder together and to form an impervious protective envelope surrounding the exposed edge of the crystal, and, preferably, bonded to at least a small annular area of the leads where they adjoin the crystal.

A generally similar structure is shown in FIG. 3. Here a thin semiconductor crystal wafer 30 is bonded to leads 31. The crystal shown is a diode having a single n-p junction 32 terminating at the peripheral edge 33 of the crystal. Each lead comprises a core component 34 of metal having a thermal expansion coefficient substantially matching that of the crystal 30, and provided with a protective surface coating 35, similar to the coating 15 of FIG. 1. The leads are welded to opposed faces of the crystal 30 by bonding layers 38 similar to the bonding layers 18 of FIG. 1. A protective glass envelope 39 is fused about the peripheral edge of the crystal 30, in glass-to-metal sealed relation with adjoining end portions of the leads 31.

Prior to applying the protective glass envelope 39, the peripheral edge portion of the crystal 30 is subjected to an oxidizing atmosphere at an elevated temperature to convert it to an edge layer 33a of silicon dioxide (or germanium dioxide, depending on the composition of the crystal 30). Such oxidation of the crystal edge may be effected by heating the assembly of crystal and leads after the leads have been welded in place and the crystal edge has been etched, in an oxidizing atmosphere. For example, the assembly may be heated to a temperature of about 600° C. in an atmosphere of nitrogen saturated with water vapor. The oxidized crystal boundary layer 33a provides a protective covering for the terminus of the n-p junction which is as free from objectionable contaminants as is the semiconductor crystal material itself. It guards against the possibility that contaminants possibly present in the outer protective glass envelope 39 may impair the electrical performance of the crystal.

Figure 4:
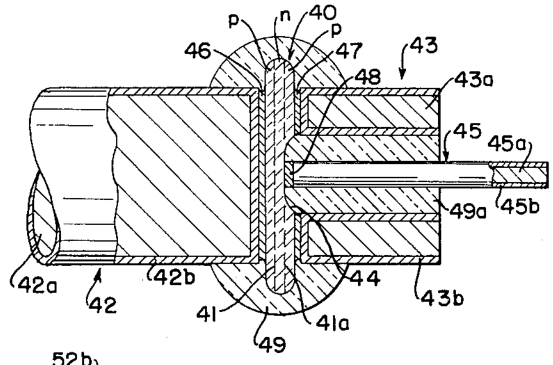
FIG. 4 is a sectional view of a transistor triode assembly.
Figures 5, 6:
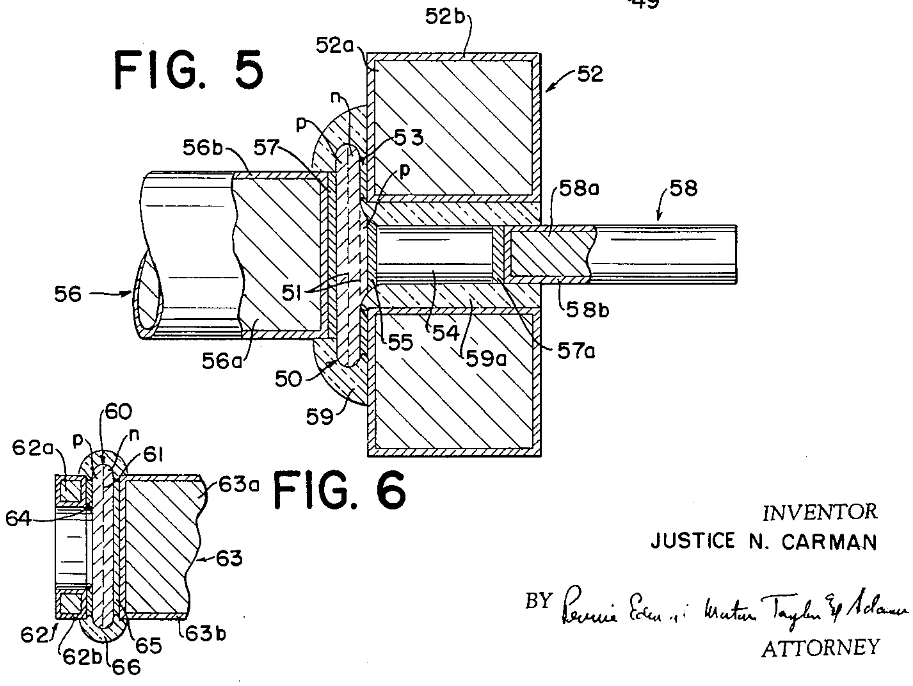
FIG. 5 is a sectional view of a transistor triode and temperature compensating resistance assembly.
FIG. 6 is a sectional view of a photodiode.

The simple diode structure described above with reference to FIGS 1 to 3 illustrates the significant and characteristic features of semiconductor devices made in accordance with the invention. FIGS. 4 to 6 show other types of semiconductor devices which similarly can be made in accordance with the invention.

FIG. 4 shows a junction transistor triode assembly made in accordance with the invention. It comprises a semiconductor crystal wafer 40 of the p-n-p type having two p type regions separated by a pair of n-p junctions 41, 41a from an intermediate n type region. One face of the wafer is bonded to a cylindrical lead 42, and the opposite face is bonded to a tubular lead 43. A central region 44 of the crystal, on the face to which the tubular lead 43 is bonded, is etched away to below the junction 41*a*, to expose the intermediate n type region of the crystal, and a third lead 45 is bonded to this intermediate region.

Each of the leads comprises a central core 42*a*, 43*a*, 45*a* having a coefficient of thermal expansion substantially matching that of the crystal, and having its surfaces adjacent the crystal covered by a protective coating 42*b*, 43*b*, 45*b* similar to the protective coating 15 of FIG. 1. Bonding layers 46, 47 and 48, each similar to the bonding layer 18 of FIG. 1, provides for secure bonding of the leads to the crystal. A protective envelope of glass 49 is fused about the peripheral edge of the crystal wafer and into glass-to-metal sealed relation with the leads 42 and 43. A body of fused glass 49*a* also fills the annular space between the tubular lead 43 and the lead 45 bonded to the intermediate region of the crystal, to insulate these leads from each other.

A modified transistor triode having a temperature sensitive resistance in series with it is shown in FIG. 5. This device comprises a semiconducting junction transistor wafer 50 of the p-n-p type having a central n type region separated by n-p junctions 51 from flanking p type regions. An annular base support 52 is bonded by a bonding layer 53 to the n type region of the crystal wafer, the peripheral portion of one of the p type regions being etched away to permit such bonding. A cylindrical body 54 of semiconductor material, preferably of the same semiconductor material as the crystal wafer 50, is bonded to the projecting face of the peripherally etched p type region by a bonding layer 55. A lead 56 is bonded to the opposite face of the crystal wafer by a bonding layer 57, and another lead 58 is bonded to the outer end of the semiconductor body 54 by a bonding layer 57*a*.

The tubular base 52 and the leads 56 and 58 each comprise a core member 52*a*, 56*a* and 58*a* having a coefficient of thermal expansion substantially matching that of the crystal. The surfaces of the base and the leads which are adjacent the crystal wafer are completely covered by a continuous coating 52*b*, 56*b* and 58*b* similar to the protective coating 15 of FIG. 1. The bonding layers 55, 57 and 57*a* likewise are similar to the bonding layers 18 of FIG. 1. A protective glass envelope 59, similar to the envelope 19 of FIG. 1, is fused into contact with the peripheral edge of the crystal wafer 50, and into glass-to-metal sealed relation with the base 52 and the oppositely disposed lead 56. A body of glass 59*a* also is fused about the semiconductor body 54 and into glass-to-metal sealed relation with the annular base 52 and the lead 58 centrally disposed therein.

In this assembly, the cylindrical body 54 of semiconducting material serves as compensating resistance for counteracting any thermally caused change in the performance of the crystal wafer. The ohmic value of the compensating resistor is determined by its length, its cross section, and its resistivity (which in turn is controlled by the amount and nature of donor or acceptor elements introduced into it). Although shown bonded to a p type region of the crystal wafer, the semiconducting body 54 may equally well be bonded to an n type region. Instead of being bonded to a central projecting face of the crystal, within the annulus of the tubular base 52, it may itself be annular in form and bonded to the etched periphery of the crystal wafer. Although FIG. 5 shows a device in which the crystal wafer is a triode transistor, it might equally well be a diode or other semiconductor element. These and other modifications in the structure shown obviously can be made without departing from the features which characterize the invention herein described.

FIG. 6 shows an application of the invention to a photoresponsive semiconductor device. The structure of FIG. 6 comprises a semiconducting crystal diode 60 having p and n regions on opposite sides of an n-p junction 61. An annular frame 62 is bonded to one face of the crystal wafer, and a lead 63 is bonded to the opposite face. The annular frame 62, and the leads 63, each comprises a core element 62*a*, 63*a* having a coefficient of thermal expansion substantially matching that of the crystal 60. All surfaces of both the frame and the lead adjacent the crystal are covered by a thin continuous coating 62*b*, 63*b* of a coating metal similar to that of the coating 15 of FIG. 1. The annular frame 62 is bonded to the crystal wafer by an annular bonding layer 64, similar in character and composition to the bonding layers 18 of FIG. 1; and the lead 63 is similarly bonded by a bonding layer 65 to the opposite face of the crystal. A protective fused glass envelope 66 similar to the envelope 19 of FIG. 1 is fused about the periphery of the crystal wafer, and into glass-to-metal sealed relation with the frame 62 and the lead 63.

Although not shown in FIG. 6, a transparent or translucent protective glass window may be fused in glass-to-metal sealed relation in the aperture of the frame 62 to prevent contamination of the otherwise exposed area of the crystal face.

It is evident from the foregoing that the basic features of the invention may be applied to a wide variety of semiconductor devices, and to numerous different mechanical designs of such devices. In all such devices, the invention provides a structure in which the semiconductor crystal is most effectively protected against contamination which might lead to deterioration of its electrical properties, and is at the same time incorporated in an assembly having a notably high degree of mechanical ruggedness. Moreover, in the preferred embodiments, semiconductor devices according to the invention are capable of sustained and reliable operations at temperatures far above those at which semiconductor devices heretofore known could operate at all.

I claim:

1. The method of making a glass encapsulated semiconductor device comprising a semiconductor crystal bounded by a circumferential edge and having at least one n-p junction terminating at said edge, which comprises bonding conductive leads to faces of said crystal on opposite sides of said junction by means of a bonding layer fusing at above 700° C., enclosing the circumferential edge of the crystal with an envelope of glass having a coefficient of thermal expansion substantially matching that of the crystal, and heating the glass-enveloped assembly of leads and crystal to a temperature above the softening point of the glass but below the fusing temperature of the bonding layer until the glass has fused into direct contact with the assembly.

2. The method of making a glass encapsulated semiconductor device comprising a siliconiferous crystal bounded by a circumferential edge and having at least one n-p junction terminating at said edge, which comprises bonding conductive leads to faces of said crystal on opposite sides of said junction by means of a bonding layer fusing at above 800° C., enclosing the circumferential edge of the crystal and the adjoining end portions of the leads in a tubular bead of glass having a coefficient of thermal expansion substantially matching that of the crystal, and heating said bead while it surrounds the crystal to a temperature above its softening point but below 800° C. until it has fused into glass-to-metal sealed relation with said leads.

3. The method of making a semiconductor device comprising a siliconiferous crystal bounded by a circumferential edge and having at least one n-p junction terminating at said edge, and having conductive leads bonded to faces of said crystal on opposite sides of said junction, which comprises applying to the conductive leads a thin continuous coating of a metal of the group consisting of platinum, palladium, rhodium, iridium, ruthenium, osmium, gold, silver, and alloys thereof, fusing a thin bonding layer of a metal selected from the group consisting of silver, platinum, palladium and alloys thereof to a face of said crystal, whereby said leads become bonded to the crystal, enclosing the circumferential edge of the crystal in a protective envelope of glass having a coefficient of thermal expansion substantially matching that of the crystal, and heating the glass-enclosed crystal to a temperature above the softening point of the glass but below the fusing temperature of the bonding layer until the glass has fused into direct contact with the assembly of leads and crystal.

4. The method according to claim 3, characterized in that the coating metal is applied to the conductive leads by electrodeposition and the resulting electrodeposit is then heated to a temperature above the sintering temperature of the coating metal.

5. The method according to claim 3, characterized in that fusion of the bonding layer is effected by heating the metal forming said layer while it is in contact with both the crystal and the coated surface of the lead to a temperature in the range from 850° C. to 1050° C.

6. The method according to claim 3, characterized in that the circumferential edge of the crystal prior to enclosure in the glass envelope is subjected to controlled oxidation to form theron a surface layer of silica.

7. The method according to claim 3, characterized in that enclosure of the circumferential edge of the crystal is effected by disposing a glass bead thereabout and about the adjoining end portions of the leads, and fusing said bead into glass-to-metal sealed relation with said leads.

8. The method according to claim 7, characterized in that the glass bead is fused at a temperature in the range from 650° C. to 800° C.

References Cited by the Examiner

UNITED STATES PATENTS 3,110,080 12/1963 Boyer ---------------- 29—25.3

RICHARD H. EANES, Jr., *Primary Examiner.*